United States Patent [19]

Varnell et al.

[11] Patent Number: 4,665,154

[45] Date of Patent: May 12, 1987

[54] HOMOGENEOUS THERMOSET COPOLYMER FROM POLY (VINYL BENZYL ETHER) AND DICYANATE ESTER

[75] Inventors: William D. Varnell, Stoddard; Thomas D. Newton, Onalaska, both of Wis.

[73] Assignee: Allied Corporation, Morristown, N.J.

[21] Appl. No.: 871,337

[22] Filed: Jun. 6, 1986

[51] Int. Cl.$^4$ ............................................. C08G 83/00
[52] U.S. Cl. .................................... 528/205; 528/172; 528/174; 528/210; 528/211; 428/411.1; 428/426
[58] Field of Search ............... 528/205, 172, 174, 210, 528/211

[56] References Cited

U.S. PATENT DOCUMENTS 4,116,946 9/1978 Jakob et al. ......................... 528/205

Primary Examiner—Harold D. Anderson
Attorney, Agent, or Firm—Thomas K. McBride; John F. Spears, Jr.; Raymond H. Nelson

[57] ABSTRACT

Novel compositions of matter comprise homogeneous thermoset copolymers resulting from the reaction between a poly(vinyl benzyl ether) of a polyphenol and a dicyanate ester of a polyether of a polyphenol may be used as components in laminates which are employed in electronic circuit boards. The copolymers will impart desirable characteristics such as high glass transition temperatures and low dielectric constants to the finished product.

17 Claims, No Drawings

HOMOGENEOUS THERMOSET COPOLYMER FROM POLY (VINYL BENZYL ETHER) AND DICYANATE ESTER

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a long period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a homogeneous thermoset copolymer of a poly(vinyl benzyl ether) of a polyphenol and a dicyanate ester of a polyether of a polyphenol may be used in the preparation of laminates which themselves will form a component of a circuit board and will possess the desirable characteristics hereinbefore set forth.

BRIEF SUMMARY OF THE INVENTION

This invention relates to homogeneous thermoset copolymers. More specifically, the invention is concerned with novel high temperature homogeneous thermoset copolymers and to a method for the preparation thereof. As was previously mentioned, the homogeneous thermoset copolymers of the present invention, which constitute novel compositions of matter, may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "crosstalk" and line capacitance. This results in faster PWB circuitry and, in addition, provides the potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. It has been found that the coefficient of expansion of the novel homogeneous thermoset copolymers of the present invention is comparable to a polyimide matrix. Furthermore, the thermal stability of the polymer matrix must be relatively high in nature inasmuch as the matrix must possess the ability to withstand soldering temperatures without melting or degrading. A desirable characteristic of the homogeneous thermoset copolymer of the present invention is that the thermal stability of the polymer is comparable to a polyimide matrix.

In addition, by varying the ratio of the poly(vinyl benzyl ether) of a polyphenol to the dicyanate ester of a polyether of a polyphenol, it is possible to provide a wide range of properties which will meet various and specific circuit board requirements. Furthermore, it is possible by preparing the copolymers in a manner also hereinafter set forth in greater detail, to provide a copolymer which will meet the requirement for chip encapsulation and potting materials.

It is therefore an object of this invention to provide novel homogeneous thermoset copolymers.

Another object of this invention is to provide a method for preparing homogeneous thermoset copolymers which are useful as a component in circuit board laminates.

In one aspect, an embodiment of this invention resides in a homogeneous thermoset copolymer of a poly(vinyl benzyl ether) of a polyphenol having the structure:

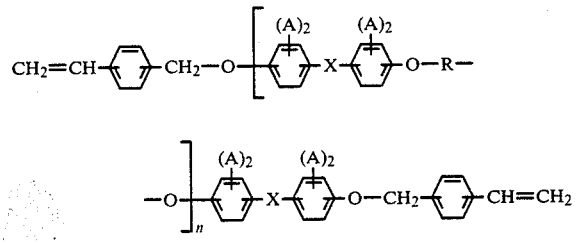

in which X is selected from the group consisting of

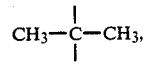

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20 and a dicyanate ester of a polyether of a polyphenol having the structure:

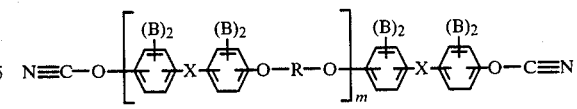

in which X is selected from the group consisting of

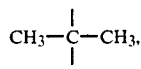

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, B is independently selected from the group consisting of hydrogen, chlorine, bromine, fluorine, alkyl, alkoxy and phenyl radicals and m has an average value in the range of from about 0 to about 20.

Another embodiment of this invention is found in a process for the production of a homogeneous thermoset copolymer which comprises reacting a poly(vinyl benzyl ether) having the structure:

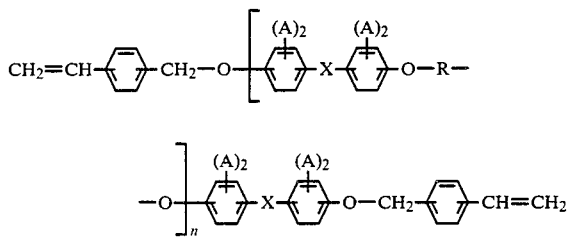

in which X is selected from the group consisting of

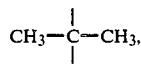

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20 with a dicyanate ester of a polyether of a polyphenol having the structure:

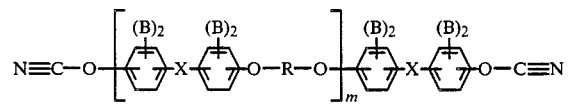

in which X is selected from the group consisting of

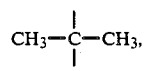

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, B is independently selected from the group consisting of hydrogen, chlorine, bromine, fluorine, alkyl, alkoxy and phenyl radicals and m has an average value in the range of from about 0 to about 20 at reaction conditions, and recovering the resultant homogeneous thermoset copolymer.

Other objects and embodiments will be found in the further detailed description of the invention.

DETAILED DESCRIPTION OF THE INVENTION

As hereinbefore set forth, the present invention is concerned with novel homogeneous thermoset copolymers and to a method for the preparation of these copolymers. The homogeneous thermoset copolymers will comprise a mixture of a poly(vinyl benzyl ether) of a polyphenol and a dicyanate ester of a polyether of a polyphenol, examples of these compounds being hereinafter set forth in greater detail. The copolymerization of these compounds will result in a copolymer which, because of its particular structure, will be useful in electronic circuitry, said composite possessing a relatively low dielectric constant and a high glass transition temperature, these characteristics being of particular advantage for use in circuit boards.

The poly(vinyl benzyl ether) of a polyphenol which forms one component of the copolymer of the present invention will possess the generic structure:

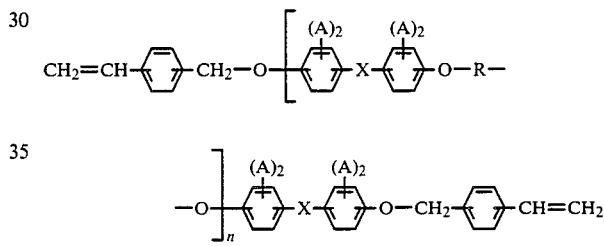

in which X is selected from the group consisting of

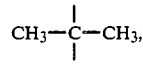

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20.

The second component of the copolymer of the present invention will comprise a dicyanate ester of a polyether of a polyphenol which possesses the generic structure:

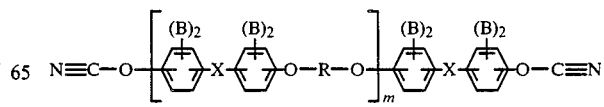

in which X is selected from the group consisting of

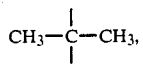

SO₂, O, S and CH₂ radicals, R is selected from the group consisting of —CH₂—C₆H₄—CH₂—, (CH₂)$_b$ in which b ranges from 1 to about 6, —CH₂—CH=CH—CH₂— and —CH₂—C≡C—CH₂— radicals, B is independently selected from the group consisting of hydrogen, chlorine, bromine, fluorine, alkyl, alkoxy and phenyl radicals and m has an average value in the range of from about 0 to about 20.

The novel homogeneous thermoset copolymers of the present invention may be prepared in any suitable manner of operation which is known in the art. For example, one method of preparing the copolymer is to blend the two components hereinbefore described to form a homogeneous melt, said blending being effected at a temperature in the range of from about 100° C. to about 200° C. The homogeneous melt may then be poured into a mold or utilized in other various ways such as encapsulating a chip, and cured at an elevated temperature in the range of from about 150° C. to about 200° C. for a period of time which may range from about 0.1 to about 1 hour, and thereafter may be post-cured at a temperature ranging from about 200° to about 260° C. for a period of time which may range from about 1 to about 12 hours in duration.

Alternatively, another method of preparing the desired copolymer of the present invention is to dissolve the poly(vinyl benzyl ether) of a polyphenol and the dicyanate ester of a polyether of a polyphenol in an appropriate solvent such as dimethyl formamide, N-methylpyrrolidinone, dimethyl acetamide, acetone, benzene, toluene, etc., in amounts so that the resulting solution will contain from about 30 to about 70% by weight of the components of the copolymer. The resulting solution may then be coated and/or impregnated on an appropriate substrate such as various resins, glass cloth, etc., and treated at an elevated temperature of from about 150° to about 180° C. for a relatively short period of time, which may range from about 1 to about 10 minutes, to obtain a prepreg. The resulting prepreg may then be stacked by pressing a predetermined number of sheets of the prepreg and pressing the stack in a heated press to form a desired laminate. The pressing of the prepreg may be effected for a period of time ranging from about 1 to about 4 hours in duration at an elevated temperature ranging from about 150° to about 190° C., at a pressure in the range of from about 500 to about 1,000 pounds per square inch gauge. Following the pressing, the laminate is then subjected to a post-cure which is effected at a temperature in the range of from about 200° to about 260° C. for a period of time which may range from about 3 to about 6 hours in duration.

It is also contemplated within the scope of this invention that the homogeneous thermoset copolymers may be prepared in a continuous manner of operation. When this type of operation is employed, the predetermined amounts of the poly(vinyl benzyl ether) of a polyphenol and the dicyanate ester of a polyether of a polyphenol which have been dissolved in an appropriate solvent of the type hereinbefore set forth in greater detail, are continuously charged to a zone which is maintained at the proper operating conditions of temperature and pressure. Those skilled in the art will recognize that a continuous reactant charge is necessary, with amounts depending upon the individual components, to provide a high yield of product which contains the desired percentage of each component in the finished homogeneous thermoset copolymers. After passage through this zone, the mixture resulting therefrom may be continuously withdrawn and utilized to coat and/or impregnate a substrate or reinforcement. The coated or impregnated substrate or reinforcement may thereafter be continuously charged to a curing zone where it is subjected to a partial cure by passage through this zone which is maintained at varying operating temperatures for a predetermined period of time. After passage through the zone, the resulting prepreg material is continuously withdrawn and passed to storage. The prepreg can then be layed up as sheets with or without a metal such as copper foil as an electrical or thermal conductor, and pressed in a predetermined number of sheets to form the desired laminate or circuit board matrix.

It is also within the scope of this invention that the circuit board precursor may be prepared by a solventless continuation lamination process. When this type of process is employed, the solid resin blend comprising at least one poly(vinyl benzyl ether) of a polyphenol and a dicyanate ester of a polyether of a polyphenol is used to impregnate a reinforcement such as glass cloth which is continuously fed through an appropriate apparatus. The reinforcement such as the glass cloth may pass through this apparatus in a single ply or, if so desired, in a predetermined number of plies, one criteria being that each ply is impregnated with the resin blend. As an alternative, it is also contemplated that, if the laminate is to be used as a circuit board, one or both sides of the laminate may be covered with a metallic coating such as copper foil. The laminate is then passed through the apparatus under predetermined conditions of temperature and pressure so as to provide a finished and cured laminate which emerges from the apparatus. This metal-covered laminate or uncovered laminate may then be cut into desired sizes and utilized, as hereinbefore set forth, as a circuit board in various electric or electronic devices.

Regardless of the method which is utilized to form the desired copolymer, it is contemplated that the two components of the final composition of matter may be present in various weight ratios. In the preferred embodiment of the invention, the poly(vinyl benzyl ether) of a polyphenol will be present in the finished composite in an amount in the range of from about 10% to about 90% by weight of the finished composite, while conversely the dicyanate ester of a polyether of a polyphenol will be present in an amount in the range of from about 90% to about 10% by weight of the composite. While these weight ratios are preferred, it is also contemplated within the scope of this invention that either of the two components may be present in the finished composite in either a greater amount or a lesser amount, depending upon the particular properties which are desired to be possessed by the finished composite.

In addition to the aforementioned favorable characteristics which are possessed by the homogeneous thermoset copolymers of the present invention, another advantage in utilizing these copolymers as components of a laminate is when employing a halogenated derivative of a poly(vinyl benzyl ether) of a polyphenol or a dicyanate ester of a polyether of a polyphenol as a component of the copolymer. The presence of these halogenated derivatives, and especially the brominated or chlorinated derivative, will introduce a desired property enhancement to a substrate or reinforcement in that the laminate may then meet certain flammability requirements such as UL 94 flammability tests.

The following examples are given for purposes of illustrating the novel homogeneous thermoset copolymers of the present invention which possess the aforementioned desirable properties and to a method for the preparation thereof. However, it is to be understood that these examples are given merely for purposes of illustration and that the present invention is not necessarily limited thereto.

EXAMPLE I

To form a desired homogeneous thermoset copolymer, 21.9 grams of styrene capped bisphenol A and 21.9 grams of the dicyanate ester of bisphenol A were dissolved at room temperature in 26 grams of dimethyl formamide. A stable homogeneous varnish resulted in which no recrystallization occurred after allowing the resin to stand for a period of 24 hours at ambient temperature. The resin was coated on a glass cloth substrate at room temperature. The solvent was removed by treatment in an oven at a temperature of 171° C. for 7 minutes. The resulting prepreg was pressed at a temperature of 177° C. and a pressure of 200 pounds per square inch gauge for a period of 1 hour to form a laminate. The laminate was then subjected to a post-cure at a temperature of 230° C. for a period of 3 hours. Analysis by DSC of the post-cured laminate showed a $T_g$ of greater than 240° C.

EXAMPLE II

In this example, 27.5 grams of styrene-capped bisphenol A and 27.4 grams of a chain-advanced dicyanate ester of bisphenol A, sold under the trade name RDX 76680 by the Celanese Corporation, were dissolved in 50 grams of dimethyl formamide at room temperature. As in the above example, no recrystallization of the resulting resin occurred after allowing the resin to stand at ambient temperature for a period of 24 hours. The resin was then used to impregnate a glass cloth after which the dimethyl formamide solvent was removed by treatment of the impregnated cloth in an oven at a temperature of 171° C. for a period of 7 minutes. The prepreg was then pressed at a temperature of 177° C. and a pressure of 200 pounds per square inch gauge for a period of 1 hour to form a laminate. This laminate was then post-cured at a temperature of 230° C. for a period of three hours. Analysis of the post-cured laminate by DSC showed a $T_g$ of greater than 240° C.

EXAMPLE III

In a manner similar to that set forth in the above examples, equal amounts of styrene-capped bisphenol A and the dicyanate ester of tetrabromo-substituted-bisphenol A are dissolved in a suitable solvent such as dimethyl formamide at a temperature of about 20° C. to form a homogeneous thermost copolymer. This copolymer is then used to impregnate a substrate such as a glass cloth which is thereafter pressed at an elevated temperature to form a laminate which is then post-cured also at an elevated temperature to form the desired product.

We claim as our invention:

1. A homogeneous thermoset copolymer of a poly(vinyl benzyl ether) of a polyphenol having the structure:

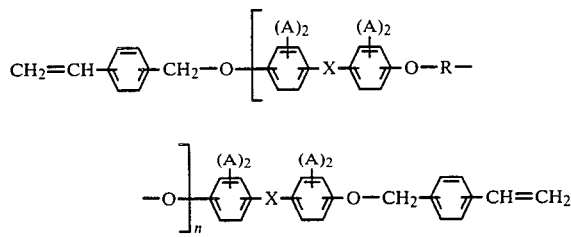

in which X is selected from the group consisting of

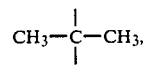

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20 and a dicyanate ester of a polyether of a polyphenol having the structure:

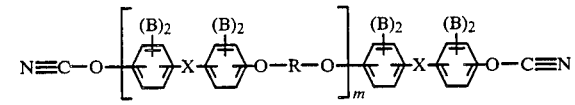

in which X is selected from the group consisting of

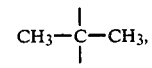

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, B is independently selected from the group consisting of hydrogen, chlorine, bromine, fluorine, alkyl, alkoxy and phenyl radicals and m has an average value in the range of from about 0 to about 20.

2. The homogeneous thermoset copolymer as set forth in claim 1 in which said poly(vinyl benzyl ether) of a polyphenol is present in said copolymer in an amount in the range of from about 10% to about 90%.

3. The homogeneous thermoset copolymer as set forth in claim 1 in which said dicyanate ester polyether of a polyphenol is present in said copolymer in an amount in the range of from about 90% to about 10%.

4. The homogeneous thermoset copolymer as set forth in claim 1 in which A is hydrogen.

5. The homogeneous thermoset copolymer as set forth in claim 1 in which A is bromine.

6. The homogeneous thermoset copolymer as set forth in claim 1 in which A is methyl.

7. The homogeneous thermoset copolymer as set forth in claim 1 in which B is hydrogen.

8. The homogeneous thermoset copolymer as set forth in claim 1 in which B is bromine.

9. The homogeneous thermoset copolymer as set forth in claim 1 in which said poly(vinyl benzyl ether) of a polyphenol has the structure:

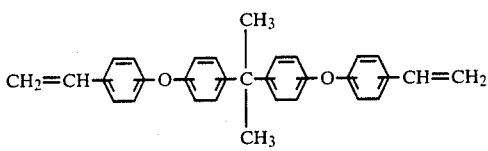

and said dicyanate ester of a polyether of a polyphenol has the structure:

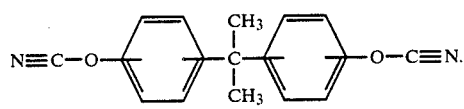

10. The homogeneous thermoset copolymer as set forth in claim 1 in which said poly(vinyl benzyl ether) of a polyphenol has the structure:

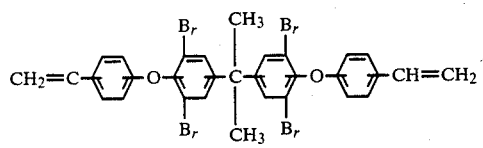

and said dicyanate ester of a polyether of a polyphenol has the structure:

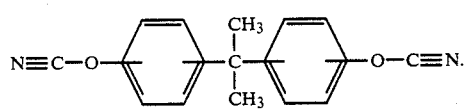

11. A process for the production of a homogeneous thermoset copolymer which comprises reacting a poly(vinyl benzyl ether) having the structure:

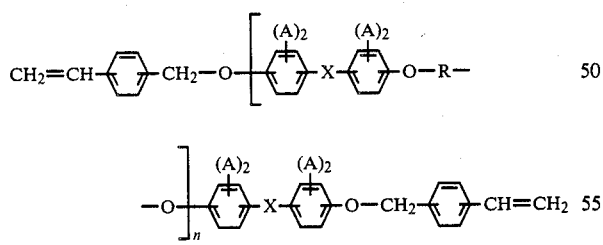

in which X is selected from the group consisting of

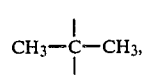

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, A is independently selected from the group consisting of hydrogen, chlorine, bromine, fluorine, alkyl, alkoxy and phenyl radicals and n has an average value in the range of from about 0 to about 20 with a dicyanate ester of a polyether of a polyphenol having the structure:

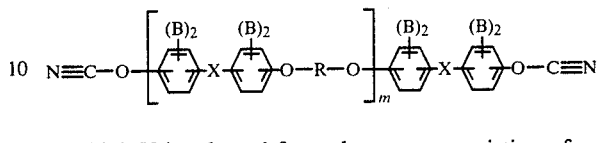

in which X is selected from the group consisting of

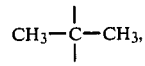

$SO_2$, O, S and $CH_2$ radicals, R is selected from the group consisting of $-CH_2-C_6H_4-CH_2-$, $(CH_2)_b$ in which b ranges from 1 to about 6, $-CH_2-CH=CH-CH_2-$ and $-CH_2-C\equiv C-CH_2-$ radicals, B is independently selected from the group consisting of hydrogen, chlorine, bromine, fluorine, alkyl, alkoxy and phenyl radicals and m has an average value in the range of from about 0 to about 20 at reaction conditions, and recovering the resultant homogeneous thermoset copolymer.

12. The process as set forth in claim 11 in which said reaction conditions include a temperature in the range of from about 100° to about 200° C. and a pressure in the range of from about atmospheric to about 50 atmospheres.

13. The process as set forth in claim 11 in which said reaction is effected by blending said poly(vinyl benzyl ether) of a polyphenol with said dicyanate ester of a polyether of a polyphenol.

14. The process as set forth in claim 11 in which said reaction is effected by admixing said poly(vinyl benzyl ether) and said dicyanate ether of a polyether of a polyphenol in a mutually miscible solvent.

15. The process as set forth in claim 14 in which said solvent is selected from the group consisting of dimethyl formamide, N-methylpyrrolidone, dimethylacetamide, acetone, benzene, toluene, and xylene.

16. The process as set forth in claim 11 in which said poly(vinyl benzyl ether) of a polyphenol has the structure:

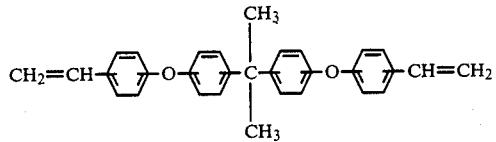

and said dicyanate ester of a polyether of a polyphenol has the structure:

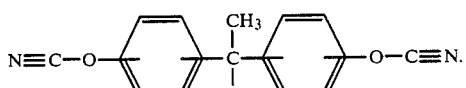

17. The process as set forth in claim 11 in which said poly(vinyl benzyl ether) of a polyphenol has the structure:
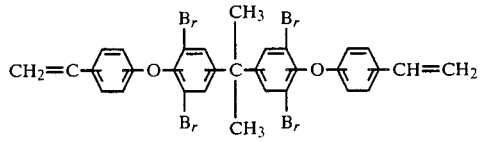
and said dicyanate ester of a polyether of a polyphenol has the structure:
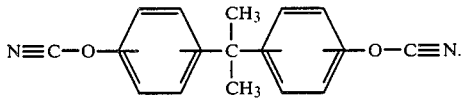
* * * * *

UNITED STATES PATENT AND TRADEMARK OFFICE
CERTIFICATE OF CORRECTION

PATENT NO. : 4,665,154
DATED : May 12, 1987
INVENTOR(S) : Varnell et al.

It is certified that error appears in the above-identified patent and that said Letters Patent is hereby corrected as shown below:

Claim 9, line 4, should read

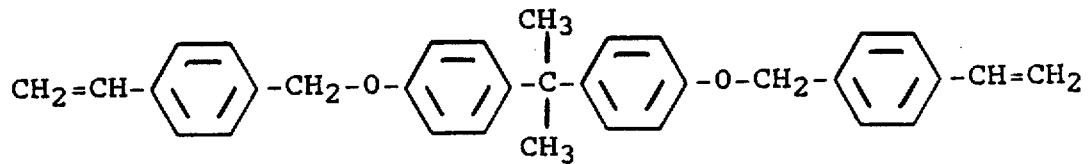

Claim 10, line 4, should read

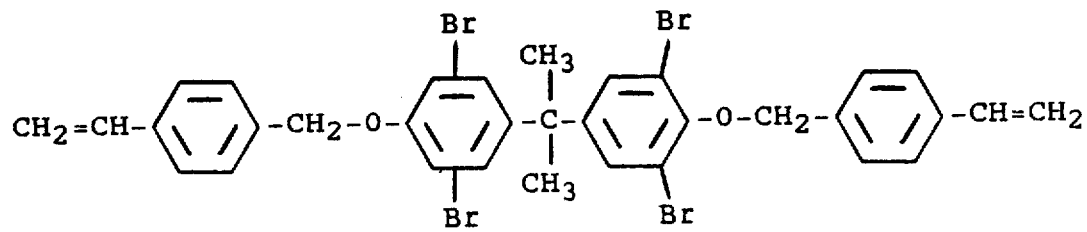

Claim 16, line 4, should read

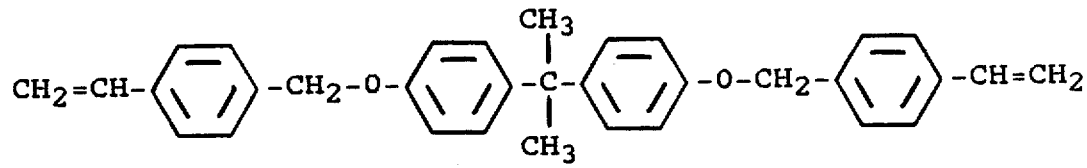

UNITED STATES PATENT AND TRADEMARK OFFICE
CERTIFICATE OF CORRECTION

PATENT NO. : 4,665,154
DATED : May 12, 1987
INVENTOR(S) : Varnell et al.

It is certified that error appears in the above-identified patent and that said Letters Patent is hereby corrected as shown below:

Claim 17, line 4, should read

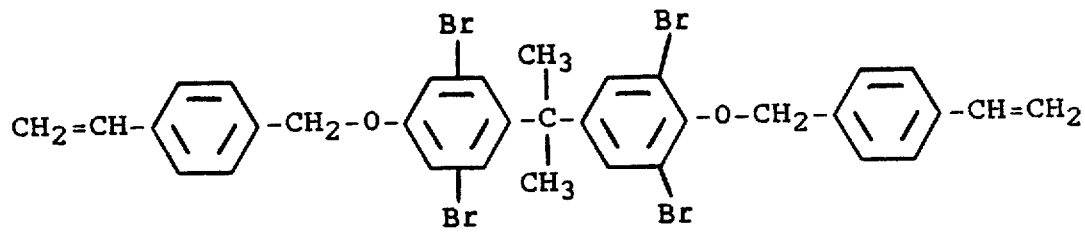

Signed and Sealed this

Twenty-sixth Day of April, 1988

Attest:

DONALD J. QUIGG

Attesting Officer

Commissioner of Patents and Trademarks